(12) United States Patent
Hirayama

(10) Patent No.: US 11,990,316 B2
(45) Date of Patent: May 21, 2024

(54) PLASMA PROCESSING APPARATUS AND PLASMA PROCESSING METHOD

(71) Applicants: TOKYO ELECTRON LIMITED, Tokyo (JP); TOHOKU UNIVERSITY, Miyagi (JP)

(72) Inventor: Masaki Hirayama, Tokyo (JP)

(73) Assignees: TOKYO ELECTRON LIMITED, Tokyo (JP); TOHOKU UNIVERSITY, Miyagi (JP)

( * ) Notice: Subject to any disclaimer, the term of this patent is extended or adjusted under 35 U.S.C. 154(b) by 414 days.

(21) Appl. No.: 17/299,588

(22) PCT Filed: Nov. 26, 2019

(86) PCT No.: PCT/JP2019/046233
§ 371 (c)(1),
(2) Date: Jun. 3, 2021

(87) PCT Pub. No.: WO2020/116256
PCT Pub. Date: Jun. 11, 2020

(65) Prior Publication Data
US 2021/0343501 A1    Nov. 4, 2021

(30) Foreign Application Priority Data

Dec. 6, 2018  (JP) .................................. 2018-229230

(51) Int. Cl.
*H01J 37/32*     (2006.01)
(52) U.S. Cl.
CPC ...... *H01J 37/321* (2013.01); *H01J 37/32715* (2013.01); *H01J 37/32834* (2013.01); *H01J 37/32577* (2013.01)

(58) Field of Classification Search
CPC ............... H01J 37/321; H01J 37/32715; H01J 37/32834; H01J 37/32577; H01J 37/32541; H01J 37/32174; H05H 1/46
See application file for complete search history.

(56) References Cited

U.S. PATENT DOCUMENTS

2021/0398786 A1\* 12/2021 Ikeda ....................... H05H 1/46

FOREIGN PATENT DOCUMENTS

JP    H09-153486 A      6/1997
JP    H09153486 A  \*   6/1997
(Continued)

*Primary Examiner* — Abdullah A Riyami
*Assistant Examiner* — Syed M Kaiser
(74) *Attorney, Agent, or Firm* — Nath, Goldberg & Meyer; Jerald L. Meyer; Tanya E. Harkins

(57) ABSTRACT

A plasma-processing apparatus includes a processing container, a stage provided within the processing container, an upper electrode provided above a front surface of the stage, with a space within the processing container interposed therebetween, a waveguide configured to introduce radio-frequency waves in a VHF/UHF band into the space, and a conductive part extending between the outer peripheral portion of the stage and a side wall of the processing container. The stage includes a metal layer. Its outer peripheral portion includes a part of the metal layer. The waveguide includes an end portion from which radio-frequency waves are emitted. The end portion is disposed to face the space. The side wall is grounded. The conductive part is electrically connected to the metal layer and the side wall while extending from the outer peripheral portion toward the side wall so that the radio-frequency waves are introduced into the space.

6 Claims, 6 Drawing Sheets

(56) References Cited

FOREIGN PATENT DOCUMENTS

| | | | | |
|---|---|---|---|---|
| JP | H10-025583 A | 1/1998 | | |
| JP | 2003-243376 A | 8/2003 | | |
| JP | 2008-156747 A | 7/2008 | | |
| JP | 2008156747 A | * 7/2008 | ......... | C23C 16/4585 |
| JP | 2014-053309 A | 3/2014 | | |
| JP | 2017-174889 A | 9/2017 | | |
| WO | 2017/221829 A | 12/2017 | | |
| WO | WO-2017221829 A1 | * 12/2017 | ......... | C23C 16/4583 |

* cited by examiner

US 11,990,316 B2

PLASMA PROCESSING APPARATUS AND PLASMA PROCESSING METHOD

This is a National Phase Application filed under 35 U.S.C. 371 as a national stage of PCT/JP2019/046233, filed Nov. 26, 2019, an application claiming the benefit of Japanese Application No. 2018-229230, filed Dec. 6, 2018, the content of each of which is hereby incorporated by reference in its entirety.

TECHNICAL FIELD

Exemplary embodiments of the present disclosure relate to a plasma processing apparatus and a plasma processing method.

BACKGROUND

A plasma processing apparatus is used in manufacturing electronic devices. Patent Document 1 discloses a technique relating to a plasma processing apparatus. The plasma processing apparatus includes a vacuum container, a processing chamber, a support electrode, an antenna and radiation port, and magnetic field forming means. The processing chamber is provided inside the vacuum chamber and is supplied with gas. The support electrode is provided in the processing chamber to support a workpiece. The antenna and radiation port supply radio frequency waves in the very-high-frequency (VHF) band or ultra-high-frequency (UHF) band to the processing chamber. The magnetic field forming means forms a magnetic field in the processing chamber. The plasma processing apparatus includes an electric field control space. The electric field control space is formed by a dielectric material and a metal partition plate or a disk-shaped metal surrounding the dielectric material. The VHF band is a frequency band in the range of about 30 MHz to 300 MHz. The UHF band is a frequency band in the range of about 300 MHz to 3 GHz.

PRIOR ART DOCUMENT

Patent Document

Patent Document 1: Japanese Laid-Open Patent Publication No. 2003-243376

A technique capable of satisfactorily introducing radio frequency waves into a space between an upper electrode and a stage in a plasma processing apparatus is provided.

SUMMARY

In an exemplary embodiment, a plasma processing apparatus is provided. The plasma processing apparatus includes a processing container, a stage, an upper electrode, a waveguide, and a conductive part. The stage is provided within the processing container. The upper electrode is provided above the front surface of the stage, with a space within the processing container interposed therebetween. The waveguide is configured to introduce radio frequency waves in a VHF band or a UHF band into the space. The conductive part extends between the outer peripheral portion of the stage and the side wall of the processing container. The stage has a metal layer. The outer peripheral portion of the stage includes a part of the metal layer. The waveguide includes an end portion from which radio frequency waves are emitted. The end portion is disposed so as to face the space. The side wall is grounded. The conductive part is electrically connected to the metal layer and the side wall of the processing container while extending from the outer peripheral portion toward the side wall so that the radio frequency waves emitted from the end portion are introduced into the space.

The present disclosure provides a technique capable of satisfactorily introducing radio frequency waves into a space between an upper electrode and a stage in a plasma processing apparatus.

DETAILED DESCRIPTION

Figure 1:
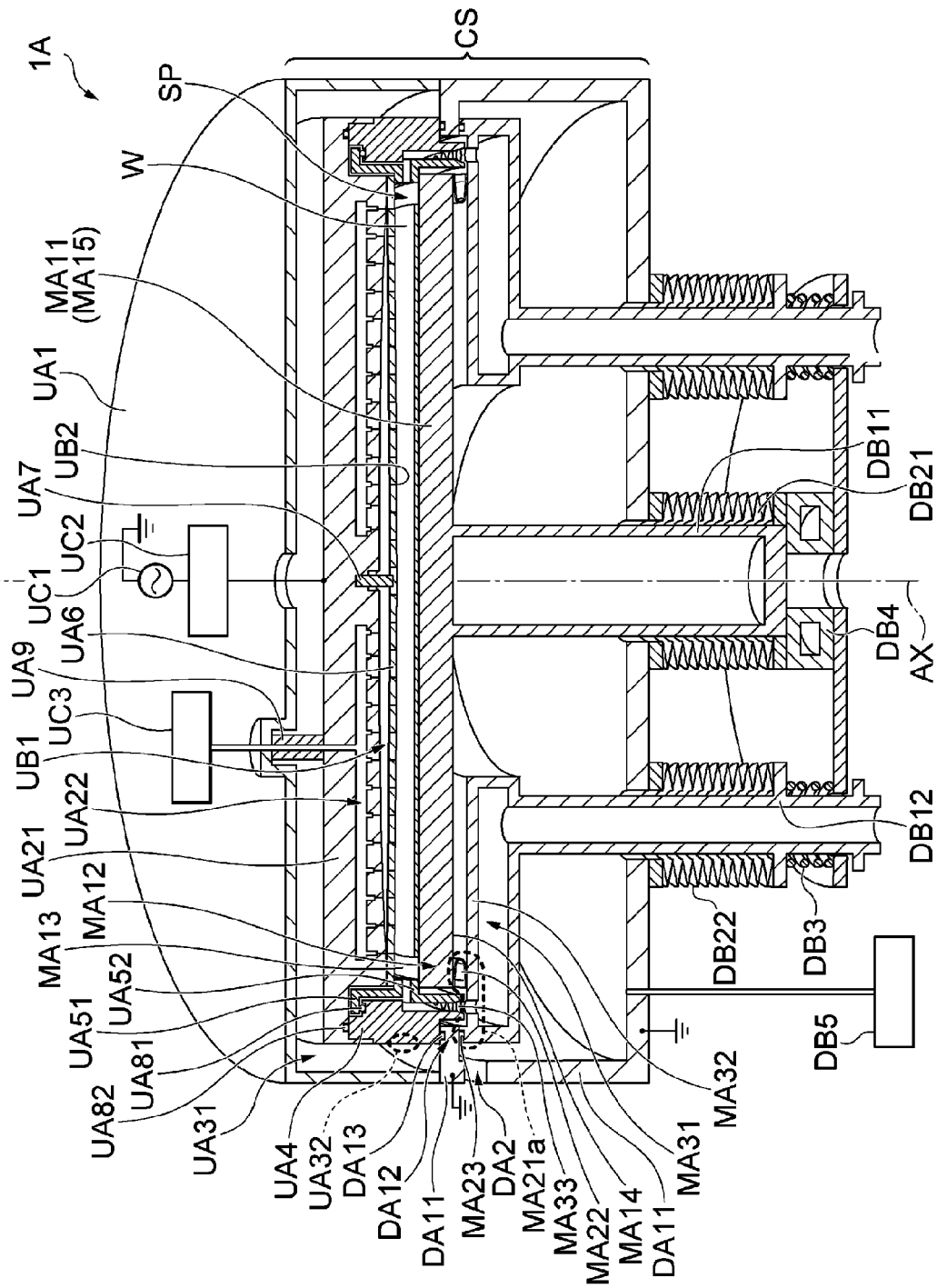
FIG. 1 is a view illustrating a configuration of a plasma processing apparatus according to an exemplary embodiment.

Hereinafter, various exemplary embodiments will be described. In an exemplary embodiment, a plasma processing apparatus is provided. The plasma processing apparatus includes a processing container, a stage, an upper electrode, a waveguide, and a conductive part. The stage is provided within the processing container. The upper electrode is provided above a front surface of the stage, with a space within the processing container being interposed therebetween. The waveguide is configured to introduce radio frequency waves in a VHF band or a UHF band into the space. The conductive part extends between an outer peripheral portion of the stage and a side wall of the processing container. The stage has a metal layer. The outer peripheral portion of the stage includes a part of the metal layer. The waveguide includes an end portion from which radio frequency waves are emitted. The end portion is disposed so as to face the space. The side wall is grounded. The conductive part is electrically connected to the metal layer and the side wall of the processing container while extending from the outer peripheral portion toward the side wall so that the radio frequency waves emitted from the end portion are introduced into the space.

In the plasma processing apparatus, radio frequency waves are supplied to the upper electrode. The radio frequency waves are introduced into the space inside the processing container from the end portion of the waveguide. The conductive part extends from the outer peripheral portion of the stage toward the side wall such that radio frequency waves emitted from the end portion of the waveguide are introduced into the space. The space which is located between the end portion of the waveguide and the above-mentioned space and in which the radio frequency waves emitted from the end portion propagate may be divided substantially equally into upper and lower sides with respect to a plane connecting the end portion and the space by the conductive part. The conductive part is electrically connected to the side wall, which is grounded, and may have an electrical shielding function. Therefore, the radio frequency waves emitted from the end portion of the waveguide may be satisfactorily introduced into the space by the conductive part without diffusing to a region extending under the stage or the like. Therefore, radio frequency waves having sufficient intensity may be supplied into the space. When radio frequency waves are introduced into the space, gas is excited in the space, and plasma is generated from the gas. Plasma is generated in the space with a uniform density distribution in the circumferential direction.

In an exemplary embodiment, the plasma processing apparatus further includes an insulating member. The insulating member is disposed between the end portion and the space. The insulating member is capable of suppressing discharge to the peripheral portion of the space.

In an exemplary embodiment, the metal layer is exposed on a rear surface of the stage. The conductive part includes a flexible conductive plate, which is in electrical contact with the rear surface in the outer peripheral portion. In this way, since the conductive part is in electrical contact with the metal layer via the flexible conductive plate, it is possible to reliably maintain the electrical contact between the conductive part and the metal layer even when the position of the conductive part changes.

In an exemplary embodiment, the conductive part includes a metal rod, which is in electrical contact with the metal layer, and a metal sheet, which is in electrical contact with the metal rod and the side wall. In particular, even when the metal layer is disposed inside the stage, the metal layer is reliably brought into electrical contact with the conductive part via the metal rod. Thus, it is possible to reliably achieve the electrical contact between the conductive part and the metal layer regardless of the position of the metal layer.

In an exemplary embodiment, the conductive part includes a metal pin, which is in electrical contact with the metal layer, and a conductive bellows, which is in electrical contact with the side wall. Even when the position of the conductive part changes, it is possible to reliably maintain the electrical contact between the conductive part and the metal layer via the metal pin. The conductive part is in electrical contact with the side wall via the conductive bellows. Therefore, even when the position of the conductive part changes, it is possible to reliably maintain the electrical contact between the conductive part and the side wall via the bellows.

The plasma processing apparatus according to an exemplary embodiment further includes an exhaust chamber. The exhaust chamber extends from the periphery of the outer peripheral portion toward the side wall, communicates with the space, and has a conductive wall portion. The conductive part includes a part of the wall portion.

The plasma processing apparatus according to an exemplary embodiment further includes an exhaust chamber. The exhaust chamber is provided inside the side wall.

In an exemplary embodiment, a plasma processing method is provided. In the plasma processing method, the plasma processing apparatus is used to perform plasma processing on a workpiece. An upper electrode, a waveguide, and a stage are provided in the processing container of the plasma processing apparatus. In this method, plasma processing is performed in a state in which an outer peripheral portion of the stage and the side wall of the processing container are electrically connected to each other such that radio frequency waves in a VHF band or in a UHF band are introduced from an end portion of the waveguide, which is provided so as to face a space between the upper electrode and the stage, into the space. The side wall is grounded. The stage has a metal layer. The outer peripheral portion includes a part of the metal layer. The plasma processing apparatus includes a conductive part. The conductive part extends between the outer peripheral portion and the side wall so as to be electrically connected to the metal layer and the side wall.

In this way, in the plasma processing method, the space which is located between the end portion of the waveguide and the above-mentioned space and in which the radio frequency waves emitted from the end portion propagate may be divided substantially equally into upper and lower sides with respect to a plane connecting the end portion and the space by the conductive part. The conductive part is electrically connected to the side wall, which is grounded, and may have an electrical shielding function. Therefore, the radio frequency waves emitted from the end portion of the waveguide may be satisfactorily introduced into the space by the conductive part without diffusing to a region extending under the stage or the like. Therefore, radio frequency waves having sufficient intensity may be supplied into the space. When radio frequency waves are introduced into the space, gas is excited in the space, and plasma is generated from the gas. Plasma is generated in the space with a uniform density distribution in the circumferential direction.

Hereinafter, various exemplary embodiments will be described in detail with reference to the drawings. In each drawing, the same or corresponding components will be denoted by the same reference numerals.

A configuration of a plasma processing apparatus 1A illustrated in FIG. 1 is described. The plasma processing apparatus 1A includes a processing container CS. The plasma processing apparatus 1A includes an upper electrode UA21, a cavity UA22, an insulating member UA4, a support ring UA51, a cover ring UA52, a dielectric plate UA6, a dielectric rod UA7, an elastic member UA81, a sealing member UA82, and a tube UA9.

The plasma processing apparatus 1A includes a stage MA11, a metal layer MA15, a conductive part MA21a, a conductive plate MA22, a conductive elastic member MA23, an exhaust chamber MA31, a wall portion MA32, and a ventilation hole MA33. The plasma processing apparatus 1A includes a sealing member DA13 and an inlet/outlet DA2. The plasma processing apparatus 1A includes a support DB11, an exhaust pipe DB12, a bellows DB21, a bellows DB22, a spring DB3, and a water-cooled plate DB4.

The processing container CS has a substantially cylindrical shape. The processing container CS extends along the vertical direction. The central axis of the processing container CS is an axis AX extending in the vertical direction. The processing container CS includes a waveguide wall UA1, a side wall DA11, and a waveguide UA31.

The ceiling of the waveguide wall UA1 extends in a plane intersecting the axis AX (substantially horizontally). The side portion of the waveguide wall UA1 extends perpendicularly to the ceiling of the waveguide wall UA1 along the axis AX. The waveguide wall UA1 surrounds the upper electrode UA21 of the plasma processing apparatus 1A.

The material of the waveguide wall UA1 may be a conductive material such as aluminum or an aluminum alloy. The waveguide wall UA1 is grounded.

The waveguide UA31 is defined by a space between the waveguide wall UA1 and the upper electrode UA21. The waveguide UA31 introduces radio frequency waves in a VHF band or a UHF band into a space SP. The waveguide UA31 includes an end portion UA32 from which the radio frequency waves are emitted. The end portion UA32 is disposed so as to face the space SP. The space SP is the space between the dielectric plate UA6 and the stage MA11.

The side wall DA11 extends along the axis AX below the side portion of the waveguide wall UA1. The side wall DA11 extends along the axis AX below the waveguide wall UA1. The material of the side wall DA11 may be a conductive material such as aluminum or an aluminum alloy. The side wall DA11 is grounded.

The side wall DA11 includes a protrusion DA12. The protrusion DA12 of the side wall DA11 is provided at the end portion of the side wall DA11 (the portion connected to the side portion of the waveguide wall UA1), and extends toward the axis AX in a direction intersecting the axis AX. The protrusion DA12 is connected to the insulating member UA4 via the sealing member DA13.

The sealing member DA13 is a member for vacuum sealing, and may be, for example, an O-ring. The protrusion DA12 is connected to the wall portion MA32 of the exhaust chamber MA31 via the conductive elastic member MA23. The conductive elastic member MA23 is an elastic body, and may be, for example, a spiral ring. The material of the conductive elastic member MA23 is, for example, a metal such as stainless steel, Inconel, nickel, tungsten, tantalum, copper alloy, or molybdenum. The conductive elastic member MA23 may be coated with a protective film such as nickel, aluminum, stainless steel, or gold.

The insulating member UA4 is disposed between the end portion UA32 and the space SP. The material of the insulating member UA4 may be an insulating material such as aluminum oxide. The insulating member UA4 and the upper electrode UA21 are connected to each other via the sealing member UA82. The sealing member UA82 is a member for vacuum sealing, and may be, for example, an O-ring.

The upper electrode UA21 is disposed below the waveguide wall UA1, and is provided above a front surface MA13 of the stage MA11, with the space SP in the processing container CS and the dielectric plate UA6 interposed therebetween. The upper electrode UA21 is electrically connected to a radio frequency power supply UC1 via a matcher UC2. The material of the upper electrode UA21 may be a conductive material such as aluminum or an aluminum alloy. A corrosion-resistant film is formed on the front surface of the upper electrode UA21. The corrosion-resistant film may be an aluminum oxide film, an yttrium oxide film, or a ceramic film containing aluminum oxide, yttrium oxide, or the like.

The radio frequency power supply UC1 is a power supply that generates the above-mentioned radio frequency waves. The matcher UC2 includes a matching circuit configured to match the load impedance of the radio frequency power supply UC1 with the output impedance of the radio frequency power supply UC1.

The upper electrode UA21 includes the cavity UA22. The cavity UA22 communicates with the gas supply part UC3 through a gas pipe. The cavity UA22 communicates with the space SP through multiple gas ejection holes UB2.

The dielectric plate UA6 is provided directly below the upper electrode UA21. The end portion of the dielectric plate UA6 is brought into close contact with the end portion of the upper electrode UA21 by the support ring UA51. The dielectric plate UA6 faces the front surface MA13 of the stage MA11, with the space SP interposed therebetween.

The central axis of the dielectric plate UA6 substantially coincides with the axis AX. In the present embodiment, the dielectric plate UA6 may be a shower plate. The dielectric plate UA6 is provided with multiple gas ejection holes UB2 in order to evenly supply gas to the entire surface of a substrate W placed on the front surface MA13 of the stage MA11.

The vertical distance between the bottom surface of the dielectric plate UA6 and the front surface MA13 of the stage MA11 (the width of the space SP) may be, for example, 5 mm or more and 15 mm or less.

The dielectric plate UA6 is flexible. The thickness of the dielectric plate UA6 may be substantially uniform. The dielectric plate UA6 has a substantially disk-like shape. The material of the dielectric plate UA6 is aluminum nitride, aluminum oxide, yttrium oxide, or a dielectric material containing aluminum nitride, aluminum oxide, yttrium oxide, and the like. A corrosion-resistant film may be formed on the surface (particularly the bottom surface) of the dielectric plate UA6. The corrosion-resistant film may be an yttrium oxide film, an yttrium oxyfluoride film, an yttrium fluoride film, or a ceramic film containing yttrium oxide, yttrium fluoride, and the like.

The support ring UA51 is a member that brings the dielectric plate UA6 into close contact with the upper electrode UA21. The support ring UA51 is held by the insulating member UA4 via the elastic member UA81. The elastic member UA81 may be, for example, an O-ring.

The cover ring UA52 is a member that holds the position of the stage MA11. The material of each of the support ring UA51 and the cover ring UA52 may be an insulating material such as aluminum oxide.

The dielectric rod UA7 is provided between the dielectric plate UA6 and the upper electrode UA21. The dielectric rod UA7 may be disposed on the axis AX. The dielectric rod UA7 is fixed to the upper electrode UA21 and is in contact with the dielectric plate UA6. The material of the dielectric rod UA7 may be a dielectric such as aluminum nitride.

The dielectric rod UA7 separates the upper electrode UA21 and the dielectric plate UA6 in a state in which the end portion of the dielectric plate UA6 is kept in contact with the upper electrode UA21 by the support ring UA51.

A gap UB1 is formed by separating the upper electrode UA21 from the dielectric plate UA6. The upper electrode UA21 and the dielectric plate UA6 are separated farthest from each other in the axis AX.

The stage MA11 is provided in the processing container CS. The stage MA11 is configured to support the substrate W placed on the front surface MA13 thereof substantially horizontally. The stage MA11 has a substantially disk-like shape.

The central axis of the stage MA11 substantially coincides with the axis AX. The stage MA11 has a metal layer MA15. In the case illustrated in FIG. 1, the stage MA11 may be constituted with the metal layer MA15.

The material of the metal layer MA15 may be a conductive material such as aluminum or an aluminum alloy. The metal layer MA15 is exposed on the rear surface MA14 of the stage MA11. The outer peripheral portion MA12 of the stage MA11 includes a part of the metal layer MA15.

In the case of the plasma processing apparatus 1A, the stage MA11 is constituted with the metal layer MA15. That is, the material of the stage MA11 in the plasma processing apparatus 1A may be a conductive material such as aluminum or an aluminum alloy.

The conductive part MA21a extends between the outer peripheral portion MA12 of the stage MA11 and the side wall DA11 of the processing container CS. The conductive part MA21a is electrically connected to the metal layer MA15 and the side wall DA11 of the processing container CS.

The conductive part MA21a extends from the outer peripheral portion MA12 toward the side wall DA11 such that the radio frequency waves emitted from the end portion UA32 are introduced into the space SP. The conductive part MA21a includes a conductive plate MA22. The conductive part MA21a includes a part of the wall portion MA32.

The conductive plate MA22 is in electrical contact with the rear surface MA14 at the outer peripheral portion MA12. The conductive plate MA22 is a flexible sheet. The material of the conductive plate MA22 is, for example, a conductive material such as aluminum, an aluminum alloy, stainless steel, Inconel, nickel, tungsten, tantalum, a copper alloy, or molybdenum. The conductive plate MA22 may be coated with a protective film such as aluminum oxide, yttrium oxide, yttrium oxyfluoride, yttrium fluoride, nickel, aluminum, stainless steel, or gold. The conductive plate MA22 is fixed to the rear surface (the rear surface MA14) of the outer peripheral portion MA12 and the top surface of the wall portion MA32 by screws (not illustrated).

The exhaust chamber MA31 includes the conductive wall portion MA32. The exhaust chamber MA31 extends from the periphery of the outer peripheral portion MA12 toward the side wall DA11. The exhaust chamber MA31 communicates with the space SP. The exhaust chamber MA31 communicates with the exhaust pipe DB12.

The exhaust pipe DB12 is connected to an external exhaust apparatus. The exhaust apparatus may include a pressure control valve and a vacuum pump such as a turbo molecular pump and/or a dry pump.

The material of the wall portion MA32 may be a conductive material such as aluminum or an aluminum alloy. The wall portion MA32 includes the ventilation hole MA33. The space SP communicates with the exhaust chamber MA31 through the ventilation hole MA33.

The gas in the space SP is capable of moving to the exhaust chamber MA31 through the ventilation hole MA33, and being exhausted to the outside through the exhaust pipe DB12.

The side wall DA11 includes the inlet/outlet DA2. The substrate W is carried into and out of the processing container CS via the inlet/outlet DA2. The space defined by the side wall DA11 and communicating with the outside through the inlet/outlet DA2 also communicates with a gas supply device DB5.

The gas supply device DB5 is capable of supplying a purge gas such as Ar gas into the space defined by the side wall DA11 and communicating with the outside via the inlet/outlet DA2.

A gas supply part UC3 is connected to the plasma processing apparatus 1A. The gas supply part UC3 is connected to a gas pipe, which is protected from radio frequency waves by an insulating tube UA9, and communicates with the cavity UA22 in the upper electrode UA21.

The gas from the gas supply part UC3 is supplied to the space SP through the cavity UA22, the gap UB1, and the gas ejection holes UB2. The gas supply part UC3 includes one or more gas sources used for processing a substrate W. The gas supply part UC3 includes one or more flow controllers configured to control the flow rates of gases from one or more gas sources, respectively.

The gas pipe, which causes the gas supply part UC3 and the cavity UA22 to communicate with each other, is covered with the insulating tube UA9 in the waveguide UA31, and is protected from radio frequency waves in the waveguide UA31 by the tube UA9. Therefore, the excitation of gas by radio frequency waves is suppressed in the gas pipe. The material of the tube UA9 may be an insulating material such as aluminum oxide.

The support DB11 is connected to the stage MA11. The stage MA11 is provided on the support DB11. The stage MA11 moves up and down by moving the support DB11 up and down (movement toward the upper electrode UA21 or movement away from the upper electrode UA21, and the same being applicable hereinafter) via the bellows DB21.

A water-cooled plate DB4 is disposed below the support DB11. The support DB11 is in contact with the water-cooled plate DB4. It is possible to discharge the heat of the stage MA11 to the outside via the support DB11 and the water-cooled plate DB4.

The exhaust pipe DB12 is connected to the wall portion MA32, and communicates with the exhaust chamber MA31. The wall portion MA32 is provided on the exhaust pipe DB12. It is possible to discharge the gas in the exhaust chamber MA31 to the outside through the exhaust pipe DB12.

By moving the exhaust pipe DB12 up and down via the bellows DB22 and the spring DB3, the exhaust chamber MA31 and the wall portion MA32 move up and down.

The material of the bellows DB22 may be a conductive material such as stainless steel. The material of the spring DB3 may be a conductive material such as stainless steel.

The wall portion MA32 may be stably disposed on the upper electrode UA21 side (upper side) due to the elasticity of the spring DB3. As a result, the outer peripheral portion of the wall portion MA32 comes into close contact with the rear surface of the protrusion DA12. Due to the elasticity of the conductive elastic member MA23, the outer peripheral portion of the wall portion MA32 and the protrusion DA12 are capable of being stably brought into electrical contact with each other.

A plasma processing method using the conductive part MA21a of the plasma processing apparatus 1A will be described. In this method, plasma processing is performed in a state in which the outer peripheral portion MA12 and the side wall DA11 are electrically connected to each other such that radio frequency waves in the VHF band or the UHF band from the end portion UA32 are introduced into the space SP. This state may be realized using the conductive part MA21a or the like. This plasma processing method may be similarly executed not only in the plasma processing apparatus 1A, but also in plasma processing apparatuses 1B to 1D to be described later.

As described above, in the plasma processing apparatus 1A, radio frequency waves are supplied from the radio frequency power supply UC1 to the upper electrode UA21. The radio frequency waves are introduced into the space SP toward the axis AX from the end portion UA32 of the waveguide UA31 via the insulating member UA4.

The conductive part MA21a (particularly a part of the wall portion MA32) extends from the outer peripheral portion MA12 toward the side wall DA11 such that the radio frequency waves emitted from the end portion UA32 are introduced into the space SP.

The space which is located between the end portion UA32 of the waveguide UA31 and the space SP and in which the radio frequency waves emitted from the end portion UA32 propagate may be divided substantially equally into the upper side and the lower side with respect to a plane connecting the end portion UA32 to the space SP by the conductive part MA21a (particularly a part of the wall portion MA32).

The conductive part MA21a is electrically connected to the side wall DA11 which is grounded, and may have an electrical shielding function.

Therefore, it is possible to cause the radio frequency waves emitted from the end portion UA32 of the waveguide UA31 to be satisfactorily introduced into the space SP by the conductive part MA21a without diffusing into a region extending below the stage MA11. Therefore, it is possible to supply radio frequency waves having sufficient intensity to the space SP.

When radio frequency waves are introduced into the space SP, gas is excited in the space SP, and plasma is generated from the gas. The plasma is generated in the space SP with a uniform density distribution in the circumferential direction. The substrate W on the stage MA11 is processed with chemical species from the plasma.

In addition, since the conductive part MA21a is in electrical contact with the metal layer MA15 via the flexible conductive plate MA22, it is possible to reliably maintain the electrical contact between the conductive part MA21a and the metal layer MA 15 even when the position of the conductive part MA21a changes.

In addition, the insulating member UA4 is capable of suppressing discharge to the peripheral portion of the space SP.

Figure 2:
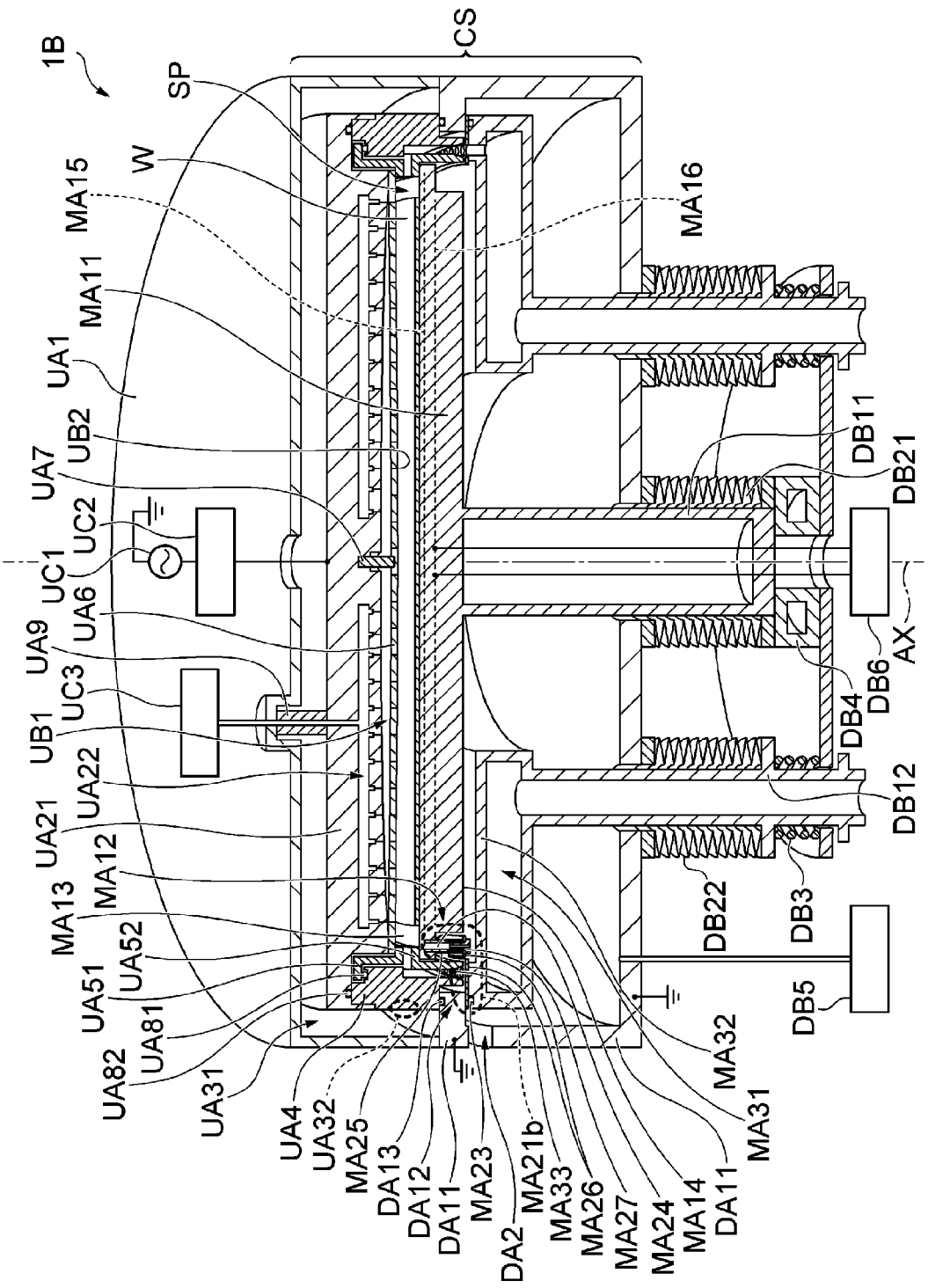
FIG. 2 is a view illustrating a configuration of a plasma processing apparatus according to another exemplary embodiment.
Figure 3:
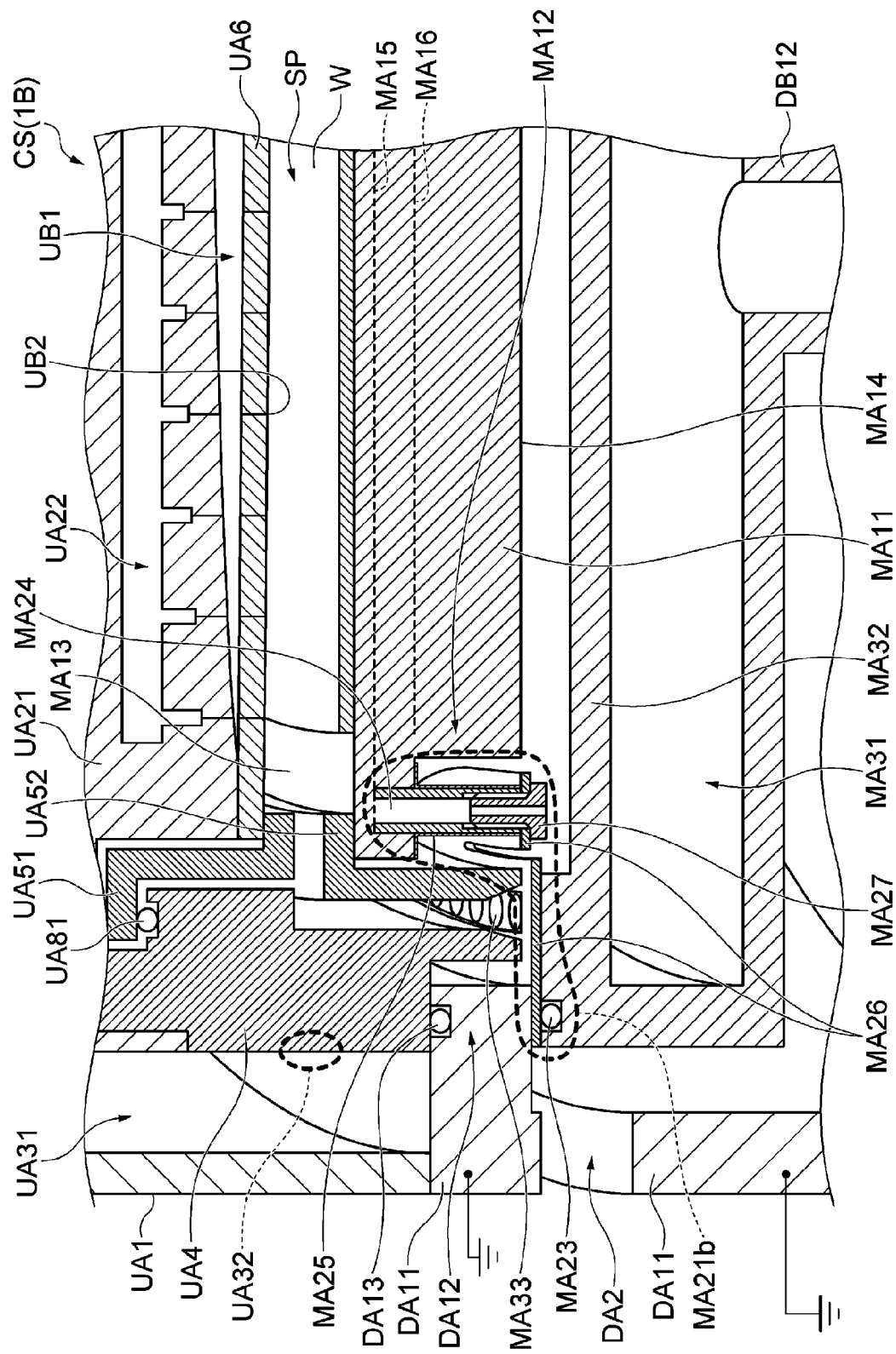
FIG. 3 is a view illustrating a part of a configuration illustrated in FIG. 2 in more detail.
Figure 4:
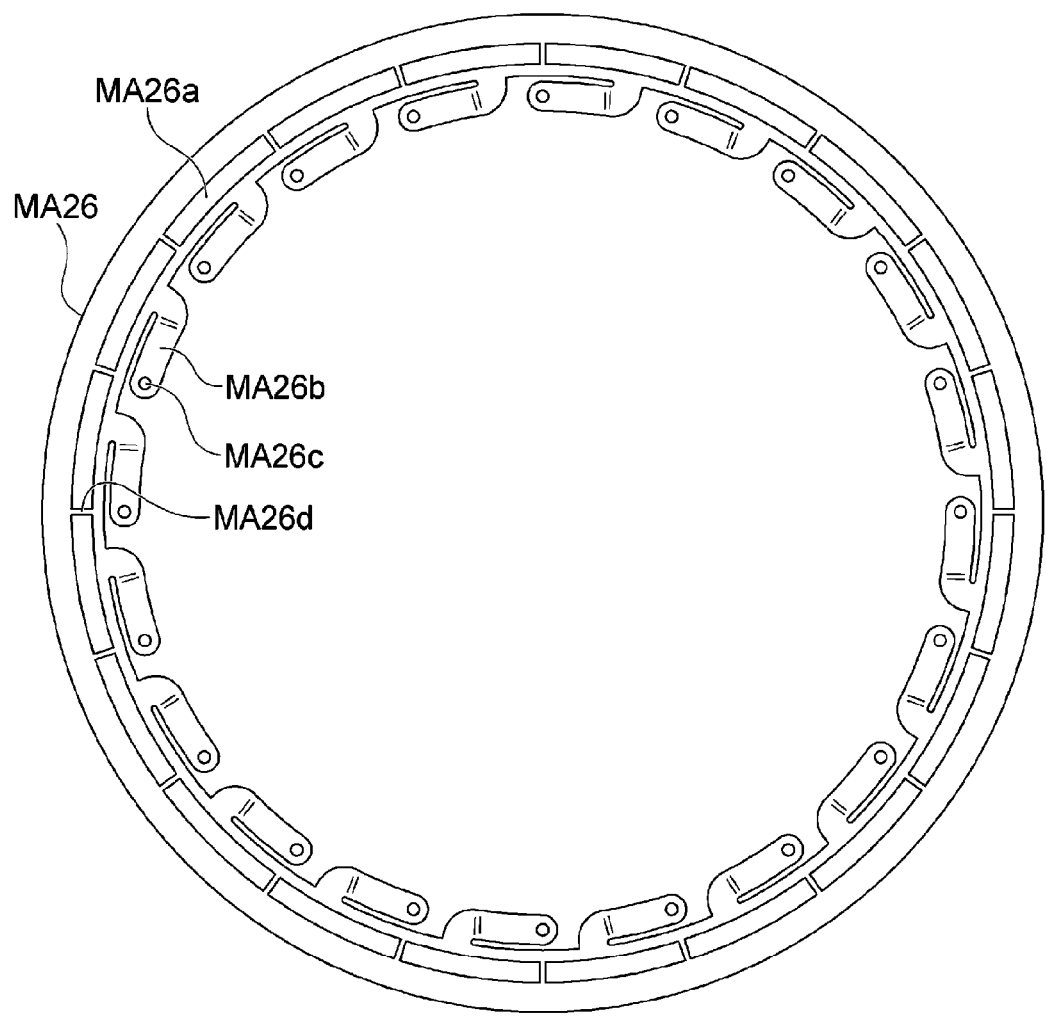
FIG. 4 is a view illustrating a part of a configuration illustrated in FIGS. 2 and 3 in more detail.

Hereinafter, a plasma processing apparatus 1B according to another exemplary embodiment will be described with reference to FIGS. 2, 3 and 4. The description of the plasma processing apparatus 1B will be given only for configurations different from those of the plasma processing apparatus 1A. The plasma processing apparatus 1B includes a conductive part MA21b instead of the conductive part MA21a. The plasma processing apparatus 1B is connected to an external heater power supply DB6.

The stage MA11 of the plasma processing apparatus 1B includes a metal layer MA15 and a heater layer MA16. In the plasma processing apparatus 1B, the material of the stage MA11 may be a dielectric material such as aluminum nitride. The metal layer MA15 and the heater layer MA16 are embedded in the stage MA11.

The heater layer MA16 is provided on the rear surface MA14 of the stage MA11, the metal layer MA15 is provided on the heater layer MA16, and a front surface MA13 is provided on the metal layer MA15.

The metal layer MA15 extends along the front surface MA13 of the stage MA11. A substrate W may come into contact with the front surface MA13. The metal layer MA15 may have, for example, a mesh-like shape. In the plasma processing apparatus 1B, the material of the metal layer MA15 may be a conductive material such as tungsten.

The heater layer MA16 extends along the front surface MA13 of the stage MA11. The heater layer MA16 supplies heat to the stage MA11 by the electric power supplied from the heater power supply DB6. The material of the heater layer MA16 may be a conductive material such as tungsten.

The conductive part MA21b includes a metal rod MA24, a protective film MA25, a metal sheet MA26, and a bolt MA27. The metal rod MA24 is in electrical contact with the metal layer MA15. The front surface of the metal rod MA24 is covered with the protective film MA25.

The metal sheet MA26 is in electrical contact with the metal rod MA24 and the side wall DA11. More specifically, the metal sheet MA26 is in electrical contact with the protrusion DA12 of the side wall DA11.

The metal sheet MA26 has a disk shape and has an opening therein. The metal sheet MA26 includes multiple openings MA26a, multiple joint portions MA26b, multiple hole portions MA26c, and multiple connecting portions MA26d.

The outer peripheral portion of the metal sheet MA26 is in close contact with the protrusion DA12 of the side wall DA11 due to the elastic force of the conductive elastic member MA23. The opening MA26a in the metal sheet MA26 is provided along the outer periphery of the metal sheet MA26.

The opening MA26a is located at the position of the ventilation hole MA33. The space SP communicates with the exhaust chamber MA31 through the opening MA26a and the ventilation hole MA33.

The joint portion MA26b protrudes inward from the outer peripheral portion of the metal sheet MA26, and includes a hole portion MA26c. The metal rod MA24 is fixed to the metal sheet MA26 via a bolt MA27 fitted into the hole portion MA26c.

The bolt MA27 is in electrical contact with the metal sheet MA26. A gas hole is provided in the center of the bolt MA27, and this gas hole causes the space inside the metal rod MA24 to communicate with the exhaust chamber MA31.

The connecting portion MA26d provided between two adjacent openings MA26a has a thermal insulation function. The connecting portion MA26d is able to suppress the conduction of heat, which is conducted from the stage MA11 via the metal rod MA24 and the joint portion MA26b, to the side wall DA11 side via the outer peripheral portion of the metal sheet MA26.

The material of the metal rod MA24 may be a conductive material such as nickel. The material of the protective film MA25 may be an insulating material such as aluminum oxide. The material of the metal sheet MA26 may be a conductive material such as aluminum or an aluminum alloy. The material of the bolt MA27 may be a conductive material such as stainless steel.

As described above, in the plasma processing apparatus 1B, radio frequency waves are supplied from the radio frequency power supply UC1 to the upper electrode UA21. The radio frequency waves are introduced into the space SP toward the axis AX from the end portion UA32 of the waveguide UA31 via the insulating member UA4.

The conductive part MA21b (particularly the metal sheet MA26) extends from the outer peripheral portion MA12 toward the side wall DA11 such that the radio frequency waves emitted from the end portion UA32 are introduced into the space SP.

The space which is located between the end portion UA32 of the waveguide UA31 and the space SP and in which the radio frequency waves emitted from the end portion UA32 propagate may be divided substantially equally into the upper side and the lower side with respect to a plane connecting the end portion UA32 to the space SP by the conductive part MA21b (particularly the metal sheet MA26).

The conductive part MA21b is electrically connected to the side wall DA11 which is grounded, and may have an electrical shielding function.

Therefore, it is possible to cause the radio frequency waves emitted from the end portion UA32 of the waveguide UA31 to be satisfactorily introduced into the space SP by the conductive part MA21b without diffusing into a region extending below the stage MA11. Therefore, it is possible to supply radio frequency waves having sufficient intensity to the space SP.

When radio frequency waves are introduced into the space SP, gas is excited in the space SP, and plasma is generated from the gas. The plasma is generated in the space SP with a uniform density distribution in the circumferential direction. The substrate W on the stage MA11 is processed with chemical species from the plasma.

Further, even when the metal layer MA15 is disposed inside the stage MA11, the metal layer MA15 is reliably brought into electrical contact with the conductive part MA21b via the metal rod MA24. Therefore, it is possible to realize electrical contact between the conductive part MA21b and the metal layer MA15 regardless of the position of the metal layer MA15.

Figure 5:
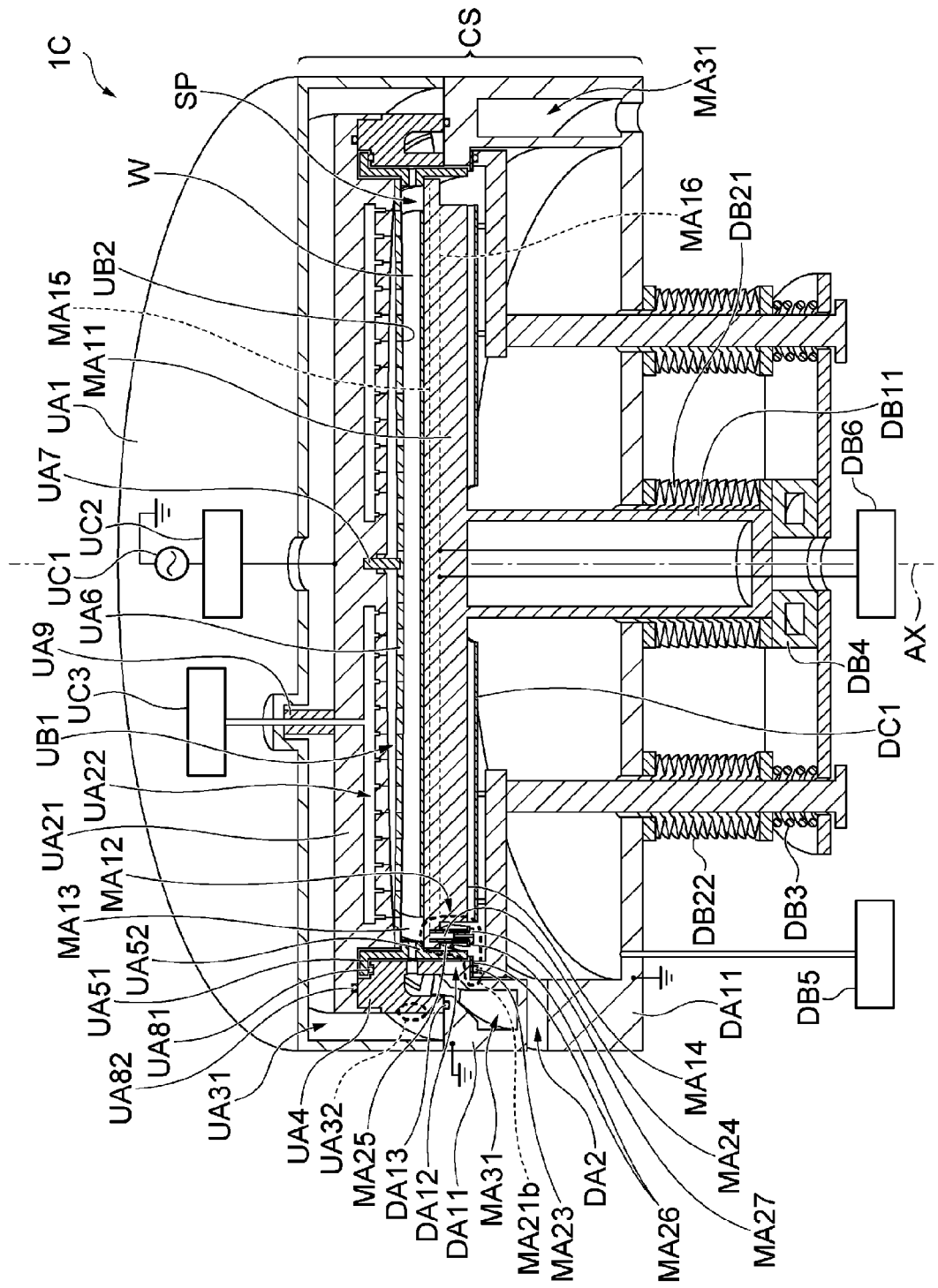
FIG. 5 is a view illustrating a configuration of a plasma processing apparatus according to another exemplary embodiment.

Hereinafter, a plasma processing apparatus 1C according to yet another exemplary embodiment will be described with reference to FIG. 5. The description of the plasma processing apparatus 1C will be given only for configurations different from those of the plasma processing apparatus 1A and the plasma processing apparatus 1B.

The plasma processing apparatus 1C has a configuration in which the exhaust chamber MA31 is embedded in the side wall DA11. The wall portion MA32 is not provided in the plasma processing apparatus 1C.

The plasma processing apparatus 1C includes a reflector DC1. The reflector DC1 extends along the rear surface MA14 of the stage MA11, and may have a function of suppressing the diffusion of heat generated from the stage MA11. The material of the reflector DC1 may be a conductive material such as aluminum or an aluminum alloy.

The plasma processing apparatus 1C includes a conductive part MA21b like the plasma processing apparatus 1B. Therefore, the plasma processing apparatus 1C is capable of exhibiting the same effect as the plasma processing apparatus 1B.

Figure 6:
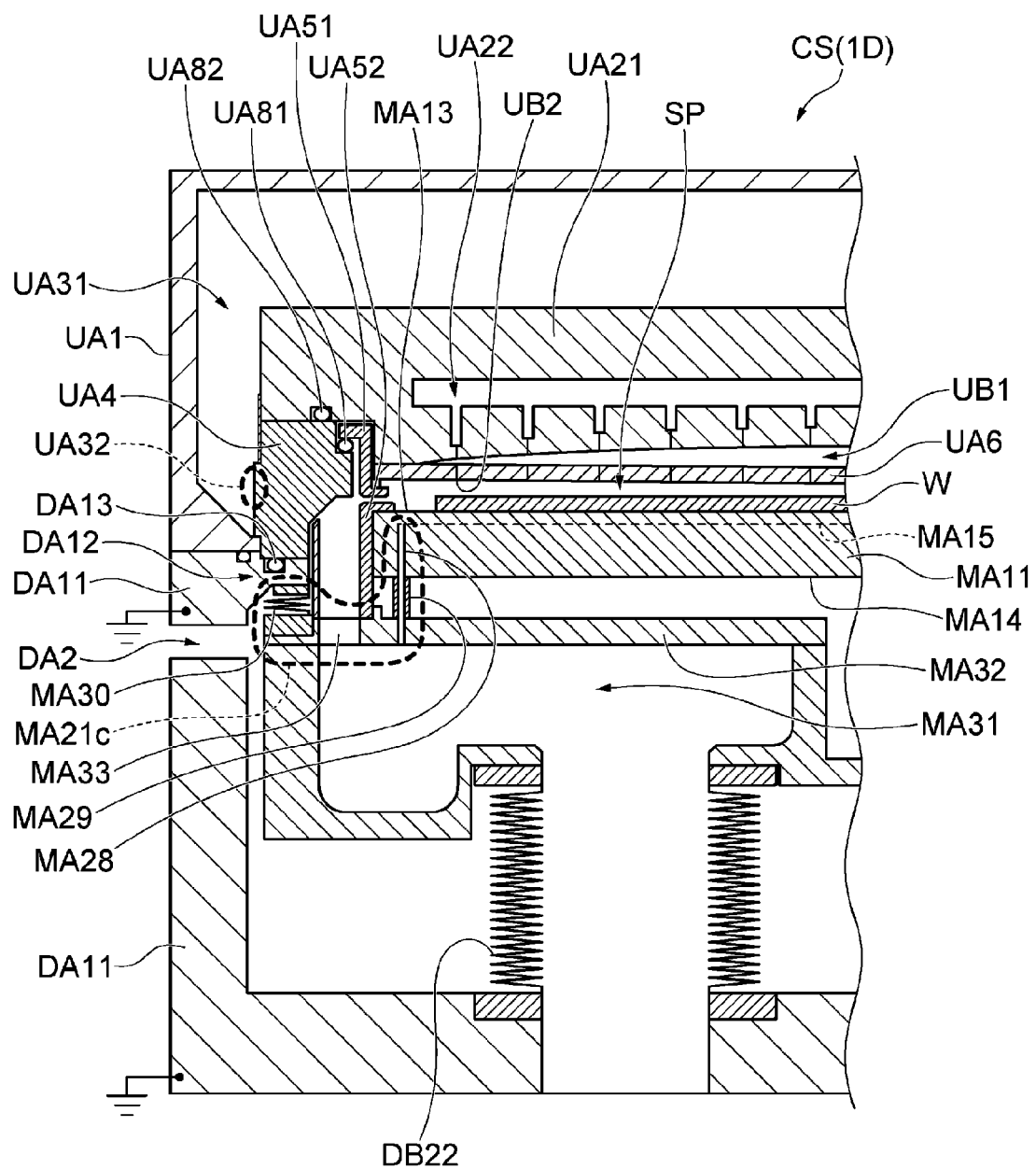
FIG. 6 is a view illustrating a part of a configuration of a plasma processing apparatus according to another exemplary embodiment.

Hereinafter, a plasma processing apparatus 1D according to still another exemplary embodiment will be described with reference to FIG. 6. The description of the plasma processing apparatus 1D will be given only for configurations different from those of the plasma processing apparatus 1A, the plasma processing apparatus 1B, and the plasma processing apparatus 1C.

The plasma processing apparatus 1D includes a conductive part MA21c instead of the conductive part MA21a and the conductive part MA21b. The conductive part MA21c includes a metal pin MA28, a pipe MA29, and a bellows MA30.

The metal pin MA28 is in electrical contact with the metal layer MA15 and the wall portion MA32. The metal pin MA28 is covered by a pipe MA29 under the rear surface MA14 of the stage MA11.

The bellows MA30 is in electrical contact with the wall portion MA32 and the side wall DA11. More specifically, the bellows MA30 is in contact with the protrusion DA12 of the side wall DA11.

In the plasma processing apparatus 1D, the material of the stage MA11 may be a dielectric material such as aluminum nitride. The material of the metal pin MA28 may be a conductive material such as nickel, tungsten, or molybdenum. The metal pin MA28 may be covered with a protective film such as aluminum oxide, yttrium oxide, yttrium oxyfluoride, or yttrium fluoride.

The material of the pipe MA29 may be an insulating material such as aluminum oxide. The material of the bellows MA30 may be a conductive material such as stainless steel.

As described above, in the plasma processing apparatus 1D, radio frequency waves are supplied from the radio frequency power supply UC1 to the upper electrode UA21. The radio frequency waves are introduced into the space SP from the end portion UA32 of the waveguide UA31 via the insulating member UA4.

The conductive part MA21c (particularly a part of the wall portion MA32) extends from the outer peripheral portion MA12 toward the side wall DA11 such that the radio frequency waves emitted from the end portion UA32 are introduced into the space SP.

The space which is located between the end portion UA32 of the waveguide UA31 and the space SP and in which the radio frequency waves emitted from the end portion UA32 propagate may be divided substantially equally into the upper side and the lower side with respect to the plane connecting the end portion UA32 to the space SP by the conductive part MA21c (particularly a part of the wall portion MA32).

The conductive part MA21c is electrically connected to the side wall DA11 which is grounded, and may have an electrical shielding function.

Therefore, it is possible to cause the radio frequency waves emitted from the end portion UA32 of the waveguide UA31 to be satisfactorily introduced into the space SP by the conductive part MA21c without diffusing into a region extending below the stage MA11. Therefore, it is possible to supply radio frequency waves having sufficient intensity to the space SP.

In addition, even when the position of the conductive part MA21c changes, it is possible to reliably maintain the electrical contact between the conductive part MA21c and the metal layer via the metal pin MA28.

The conductive part MA21c is in electrical contact with the side wall DA11 via the conductive bellows MA30. Therefore, even when the position of the conductive part MA21c changes, it is possible to reliably maintain the electrical contact between the conductive part MA21c and the side wall DA11 via the bellows MA30.

When radio frequency waves are introduced into the space SP, gas is excited in the space SP, and plasma is generated from the gas. The plasma is generated in the space SP with a uniform density distribution in the circumferential direction. A substrate W on the stage MA11 is processed with chemical species from the plasma.

Although various exemplary embodiments have been described above, the present disclosure is not limited to the exemplary embodiments described above, and various omissions, substitutions, and changes may be made. In addition, elements in different exemplary embodiments may be combined to form another exemplary embodiment.

From the foregoing, it will be understood that various exemplary embodiments of the present disclosure have been described herein for purposes of illustration, and that various modifications can be made without departing from the scope and spirit of the present disclosure. Accordingly, the various exemplary embodiments disclosed herein are not intended to be limiting, and the true scope and spirit of the disclosure is indicated by the appended claims.

EXPLANATION OF REFERENCE NUMERALS

1A: plasma processing apparatus, 1B: plasma processing apparatus, 1C: plasma processing apparatus, 1D: plasma processing apparatus, AX: axis, CS: processing container, DA11: side wall, DA12: protrusion, DA13: sealing member, DA2: inlet/outlet, DB11: support, DB12: exhaust pipe, DB21: bellows, DB22: bellows, DB3: spring, DB4: water-cooled plate, DB5: gas supply device, DB6: heater power supply, DC1: reflector, MA11: stage, MA12: outer peripheral portion, MA13: front surface, MA14: rear surface, MA15: metal layer, MA16: heater layer, MA21a: conductive part, MA21b: conductive part, MA21c: conductive part, MA22: conductive plate, MA23: conductive elastic member, MA24: metal rod, MA25: protective film, MA26: metal sheet, MA26a: opening, MA26b: joint portion, MA26c: hole portion, MA26d: connecting portion, MA27: bolt, MA28: metal pin, MA29: pipe, MA30: bellows, MA31: exhaust chamber, MA32: wall portion, MA33: ventilation hole, SP: space, UA1: waveguide wall, UA21: upper electrode, UA22: cavity, UA31: waveguide, UA32: end portion, UA4: insulation member, UA51: support ring, UA52: cove ring, UA6: dielectric plate, UA7: dielectric rod, UA81: elastic member, UA82: sealing member, UA9: tube, UB1: gap, UB2: gas ejection hole, UC1: radio frequency power supply, UC2: matcher, UC3: gas supply part, W: substrate.

What is claimed is:

1. A plasma processing apparatus comprising:
a processing container;
a stage provided within the processing container;
an upper electrode provided above a front surface of the stage, with a space within the processing container interposed therebetween;
a waveguide configured to introduce radio frequency waves in a VHF band or a UHF band into the space; and
a conductive part extending between an outer peripheral portion of the stage and a side wall of the processing container,
wherein the stage includes a metal layer,
the outer peripheral portion of the stage includes a part of the metal layer,
the waveguide includes an end portion from which the radio frequency waves are emitted,
the end portion is disposed so as to face the space,
the side wall is grounded, and
the conductive part is electrically connected to the metal layer and the side wall of the processing container, and extends from the outer peripheral portion toward the side wall so that the radio frequency waves emitted from the end portion are introduced into the space,
wherein the metal layer is exposed on a rear surface of the stage, and
the conductive part includes a flexible conductive plate, which is in electrical contact with the rear surface in the outer peripheral portion.

2. The plasma processing apparatus of claim 1, further comprising an insulating member disposed between the end portion and the space.

3. The plasma processing apparatus of claim 1, further comprising an exhaust chamber,
wherein the exhaust chamber extends from a periphery of the outer peripheral portion toward the side wall so as to communicate with the space and includes a conductive wall portion, and
the conductive part includes a part of the wall portion.

4. A plasma processing apparatus comprising:
a processing container;
a stage provided within the processing container;
an upper electrode provided above a front surface of the stage, with a space within the processing container interposed therebetween;
a waveguide configured to introduce radio frequency waves in a VHF band or a UHF band into the space; and
a conductive part extending between an outer peripheral portion of the stage and a side wall of the processing container,
wherein the stage includes a metal layer,
the outer peripheral portion of the stage includes a part of the metal layer,
the waveguide includes an end portion from which the radio frequency waves are emitted,
the end portion is disposed so as to face the space,
the side wall is grounded,
the conductive part is electrically connected to the metal layer and the side wall of the processing container, and extends from the outer peripheral portion toward the side wall so that the radio frequency waves emitted from the end portion are introduced into the space, and
the conductive part includes a metal rod, which is in electrical contact with the metal layer, and a metal sheet, which is in electrical contact with the side wall.

5. The plasma processing apparatus of claim 4, further comprising an exhaust chamber provided inside the side wall.

6. A plasma processing apparatus comprising:
a processing container;
a stage provided within the processing container;
an upper electrode provided above a front surface of the stage, with a space within the processing container interposed therebetween;
a waveguide configured to introduce radio frequency waves in a VHF band or a UHF band into the space; and
a conductive part extending between an outer peripheral portion of the stage and a side wall of the processing container,
wherein the stage includes a metal layer,
the outer peripheral portion of the stage includes a part of the metal layer,
the waveguide includes an end portion from which the radio frequency waves are emitted,
the end portion is disposed so as to face the space,
the side wall is grounded,
the conductive part is electrically connected to the metal layer and the side wall of the processing container, and extends from the outer peripheral portion toward the side wall so that the radio frequency waves emitted from the end portion are introduced into the space, and
the conductive part includes a metal pin, which is in electrical contact with the metal layer, and a conductive bellows, which is in electrical contact with the side wall.

* * * * *